United States Patent
Burns

[11] Patent Number: 5,945,732
[45] Date of Patent: *Aug. 31, 1999

[54] APPARATUS AND METHOD OF MANUFACTURING A WARP RESISTANT THERMALLY CONDUCTIVE INTEGRATED CIRCUIT PACKAGE

[75] Inventor: Carmen D. Burns, Austin, Tex.

[73] Assignee: Staktek Corporation, Austin, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/815,537

[22] Filed: Mar. 12, 1997

[51] Int. Cl.⁶ .......................... H01L 23/495; H05K 5/02
[52] U.S. Cl. .......................... 257/674; 257/666; 257/677; 361/813
[58] Field of Search .................. 257/674, 666, 257/673, 675, 676, 677, 685, 686, 690, 692, 706, 713, 736, 750, 781, 782, 783, 796; 438/123; 361/813

[56] References Cited

U.S. PATENT DOCUMENTS

| | | | |
|---|---|---|---|
| 3,436,604 | 4/1969 | Hyltin et al. | 317/101 |
| 3,614,546 | 10/1971 | Avins | 317/234 R |
| 3,713,893 | 1/1973 | Shirland | 437/205 X |
| 3,739,462 | 6/1973 | Hasty | 29/577 |
| 4,103,318 | 7/1978 | Schwede | 361/388 |
| 4,158,745 | 6/1979 | Keller | 174/52 FP |
| 4,241,493 | 12/1980 | Andrulits et al. | 437/209 X |
| 4,288,841 | 9/1981 | Gogal | 361/414 |
| 4,321,418 | 3/1982 | Dran et al. | 264/102 X |
| 4,437,235 | 3/1984 | McIver | 29/840 |
| 4,451,973 | 6/1984 | Tateno et al. | 29/588 |
| 4,521,828 | 6/1985 | Fanning | 361/386 |
| 4,525,921 | 7/1985 | Carson et al. | 29/577 |
| 4,530,152 | 7/1985 | Roche et al. | 29/588 |
| 4,630,172 | 12/1986 | Stenerson et al. | 361/386 |
| 4,633,573 | 1/1987 | Scherer | 29/589 |
| 4,680,617 | 7/1987 | Ross | 357/72 |
| 4,684,975 | 8/1987 | Takiar et al. | 357/70 |
| 4,722,060 | 1/1988 | Quinn et al. | 364/490 |

(List continued on next page.)

FOREIGN PATENT DOCUMENTS

| | | |
|---|---|---|
| 57-31166 | 2/1982 | Japan . |
| 58-96756 | 6/1983 | Japan . |
| 58-112348 | 7/1983 | Japan . |
| 61-163652 | 1/1985 | Japan . |
| 60-180150 | 9/1985 | Japan . |
| 63-153849 | 6/1988 | Japan . |
| 63-53959 | 8/1988 | Japan . |
| 3-125440 | 5/1991 | Japan . |
| 4207061 | 7/1992 | Japan . |

OTHER PUBLICATIONS

Information allegedly written by Emory Garth regarding "Memory Stacks," Applicant received a facsimile from Emory Garth on Jan. 26, 1993, Applicant does not know when this information was written or its validity.

Catalog of Dense–Pac Microsystems, Inc. describing two products: DPS512X163 Ceramic 514K X 16 CMOS SRAM Module and DPS512X16AA3 High Speed Ceramic 512K X 16 CMOS SRAM Module, pp. 865–870.

Primary Examiner—Mahshid Saadat
Assistant Examiner—Jhihan B. Clark
Attorney, Agent, or Firm—Fulbright & Jaworski

[57] ABSTRACT

An integrated circuit package for improved warp resistance and heat dissipation is described. The LOC package includes: an integrated circuit die having an upper, active face, and a multi-layered, substantially planar lead frame mounted to the active face of the die, where the lead frame is preferably comprised of layers configured as Cu/INVAR/Cu or Cu/Alloy 42/Cu. The choice of the middle layer of the lead frame is selected to minimize the warping forces on the package such that the coefficient of thermal expansion of the composite lead frame approximates that of silicon. The copper layers of the lead frame provide improved heat dissipation.

11 Claims, 1 Drawing Sheet

U.S. PATENT DOCUMENTS

| | | | |
|---|---|---|---|
| 4,733,292 | 3/1988 | Jarvis | 257/670 |
| 4,733,461 | 3/1988 | Nakano | 29/830 |
| 4,763,188 | 8/1988 | Johnson | 357/74 |
| 4,796,078 | 1/1989 | Phelps, Jr. et al. | 357/68 |
| 4,811,166 | 3/1989 | Alvarez et al. | 257/706 |
| 4,821,148 | 4/1989 | Kobayashi et al. | 361/392 |
| 4,823,234 | 4/1989 | Konishi et al. | 361/386 |
| 4,829,403 | 5/1989 | Harding | 361/386 |
| 4,833,568 | 5/1989 | Berhold | 361/383 |
| 4,839,717 | 6/1989 | Phy et al. | 357/74 |
| 4,855,868 | 8/1989 | Harding | 361/386 |
| 4,862,245 | 8/1989 | Pashby et al. | 357/70 |
| 4,862,249 | 8/1989 | Carlson | 357/80 |
| 4,878,106 | 10/1989 | Sachs | 357/72 |
| 4,884,237 | 11/1989 | Mueller et al. | 365/63 |
| 4,891,789 | 1/1990 | Quattrini et al. | 365/63 |
| 4,948,645 | 8/1990 | Holzinger et al. | 156/252 |
| 4,953,005 | 8/1990 | Carlson et al. | 357/80 |
| 4,953,060 | 8/1990 | Lauffer et al. | 361/388 |
| 4,994,411 | 2/1991 | Naito et al. | 437/217 |
| 4,997,517 | 3/1991 | Pathasarathi | 156/630 |
| 5,014,113 | 5/1991 | Casto | 357/70 |
| 5,016,138 | 5/1991 | Woodman | 361/381 |
| 5,041,015 | 8/1991 | Travis | 439/492 |
| 5,049,527 | 9/1991 | Merrick et al. | 437/220 |
| 5,057,906 | 10/1991 | Ishigami | 357/80 |
| 5,065,277 | 11/1991 | Davidson | 361/383 |
| 5,086,018 | 2/1992 | Conru et al. | 437/237 |
| 5,089,876 | 2/1992 | Ishioka | 357/70 |
| 5,099,393 | 3/1992 | Bentlage et al. | 361/413 |
| 5,108,553 | 4/1992 | Foster et al. | 29/852 |
| 5,134,463 | 7/1992 | Yamaguchi | 357/81 |
| 5,138,430 | 8/1992 | Gow, 3rd et al. | 357/70 |
| 5,138,434 | 8/1992 | Wood et al. | 357/74 |
| 5,139,696 | 8/1992 | Mori | 437/183 |
| 5,147,822 | 9/1992 | Yamazaki et al. | 437/215 |
| 5,151,559 | 9/1992 | Conru et al. | 174/52.4 |
| 5,155,068 | 10/1992 | Tda | 437/211 |
| 5,157,478 | 10/1992 | Ueda et al. | 357/72 |
| 5,214,845 | 6/1993 | King et al. | 29/841 |
| 5,216,283 | 6/1993 | Lin | 257/787 |
| 5,223,739 | 6/1993 | Katsumata et al. | 257/676 |
| 5,304,847 | 4/1994 | Neugebauer et al. | 257/762 |
| 5,367,766 | 11/1994 | Burns et al. | 29/848 |
| 5,616,953 | 4/1997 | King et al. | 257/666 |

APPARATUS AND METHOD OF MANUFACTURING A WARP RESISTANT THERMALLY CONDUCTIVE INTEGRATED CIRCUIT PACKAGE

BACKGROUND OF THE INVENTION

1. Field of the Invention.

The field of the invention relates to a lead-on-chip (LOC) integrated circuit package which includes a multi-layered lead frame for improved heat dissipation and warp resistance.

2. Brief Description of the Related Technology.

For greater heat dissipation, integrated circuit (IC) packages sometimes utilize a lead-on-chip (LOC) design, where a substantially planar lead frame is mounted to an IC die. The lead frame is usually comprised of a single electrically and thermally conductive material, such as copper or alloy 42. See U.S. Pat. Nos. 5,221,642 and 5,448,450, both assigned to the common assignee of the present invention. Other LOC IC packages include a single material lead frame which is electrically and thermally conductive and which is thinned in an area over the die to which it is mounted. See application Ser. No. 08/688,340, filed Jul. 30, 1996, assigned to the common assignee of the present invention.

To minimize the warping forces on an IC package, a warp resistant material having a coefficient of thermal expansion (CTE) selected to balance the warping forces extant on the IC package during assembly, testing or operation is mounted to one or more exterior surfaces of the IC package. Examples of such warp resistant packages and the techniques used to select the appropriate warp resistant material layers are described in U.S. Pat. Nos. 5,369,056, 5,369,058, and 5,581,121, and in application Ser. No. 08/644,491, filed May 10, 1996, pending, all assigned to the common assignee of the present invention.

A need exists for a LOC IC package which controls package warping, allows for improved thermal dissipation, but does not require a warp resistant material layer mounted to the package exterior or require that the LOC lead frame be thinned in an area directly over the die.

SUMMARY OF THE INVENTION

To resolve the need, the present invention includes an IC package in a LOC configuration which includes a multi-layered lead frame of uniform thickness over the active face of the die. The materials and thickness of the various layers of the lead frame are selected to ensure improved heat dissipation and to minimize package warping forces.

Preferably, the lead frame has three layers, with the first and third layers being copper, and the second layer being a warpage control material sandwiched between the first and third layers. The warpage control layer may be, for example, INVAR or alloy 42 material which has the effect of lowering the CTE of the composite lead frame such that it approximates that of silicon. Using this type of LOC configuration, warp resistant material layers mounted to the package exterior are not necessary in many applications.

DETAILED DESCRIPTION OF THE PREFERRED EMBODIMENTS

Figure 1:
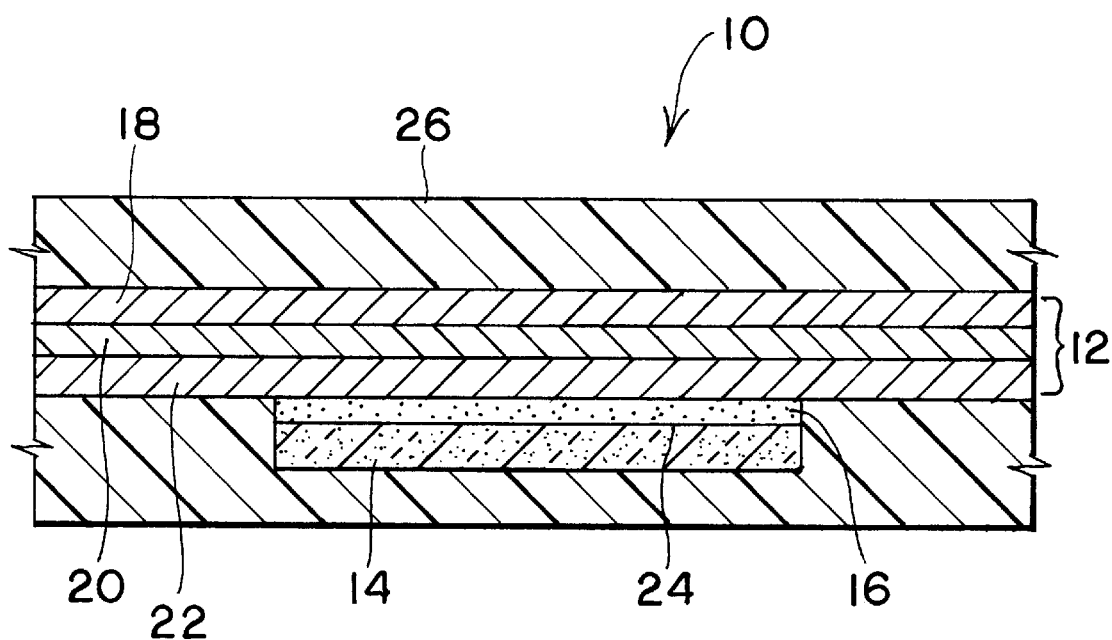
FIG. 1 is a partial cross-sectional view of the IC package of the present invention.

As illustrated in FIG. 1, each IC package 10 includes an integrated circuit die 14 which includes an active face 24 which includes die bonding pads (not shown). A multi-layered substantially planar lead frame 12 overlays the active face 24 of die 14 to provide electrical connectivity, improve thermal coupling and, as configured, improve warp resistance for package 10. Although not shown, the portions of lead frame 12 which extend beyond the perimeter of die 14 protrude through an edge of a casing 26 to form external electrical leads for the package.

Lead frame 12 is multi-layered and is mounted and adhered to the active face 24 of die 14 by adhesive layer 16, which is preferably a two-sided adhesive polyimide film, such as KAPTON by DuPont. Such a two-sided film typically has a thin layer of high temperature epoxy applied to both sides of the film. Adhesive layer 16 may otherwise be a high temperature adhesive epoxy, such as Rogers Corp. R/flex (R) 8970, which is a B-staged phenolic butyryl epoxy which is typically laminated at a temperature of about 130° C. and cured at a temperature of about 175° C. Alternatively, lead frame 12 may be adhered to die 14 using molding compound, or using other single or double-sided adhesives, such as those described in U.S. Pat. Nos. 5,279,029, 5,367, 766 and 5,221,642, all of which are assigned to the common assignee of the present invention and which are all incorporated herein for all purposes. For either the one or two-sided adhesive or epoxy embodiment for adhesive layer 16, first layer 22 of lead frame 12 is mounted to the active face 24 of die 14 by the adhesive layer 16.

Multi-layer lead frame 12 is preferably about 5.0 mils thick and includes: a first layer 22 of copper approximately 0.75 mils thick, a third layer 18 of copper approximately 0.75 mils thick, and a second layer 20 of a warp resistant material, such as INVAR or alloy 42 material, approximately 3.5 mils thick sandwiched between first layer 22 and second layer 18 of lead frame 12. Preferably, the ratio of the amount of copper to the total amount of material comprising lead frame 12 ranges from about 20% to 33%. Alternatively, first and third lead frame layers, 22 and 18 respectively, may each be an INVAR layer about 2.0 mils thick. In such an embodiment, the middle second lead frame layer is a layer of copper about 1.0 mils thick. This alternative embodiment, however, might not perform as well electrically as the prior described embodiment. Lead frame 12 is thus configured as a multi-layered metal or metallic composite element configured as layers of Cu/INVAR/Cu, Cu/Alloy 42/Cu, or INVAR/Cu/INVAR.

Alloy 42 is a metal composition made up of about 42% nickel and 58% iron and INVAR is an iron-nickel based alloy being about 63% iron and 46% nickel. Although both alloy 42 and INVAR are less efficient in heat dissipation than other materials, such as copper, both alloy 42 and INVAR provide an advantage in preventing warpage, while heat dissipation is adequately provided by heat dissipating elements or layers, such as first layer 22 and third layer 18 of lead frame 12, where the first and third layers are preferably copper.

Lead frame 12 may be manufactured by electroplating copper to a thin sheet of INVAR or alloy 42 which has been rolled or stamped, using known methods, to flatten the thin sheet and to form electrical conductors for lead frame 12. Alternatively, the thin sheet of INVAR or alloy 42 may first be electroplated with a copper layer and then flattened to thin the thin sheet and to form the electrical conductors. If the conductors are formed by etching, lead frame 12 would first be electroplated with a copper layer after the etching process because of the different chemical processes required for etching the INVAR or alloy 42 layer versus etching the copper layer.

Regardless of the method used to manufacture lead frame 12, the goal is to make the CTE of the composite lead frame 12 as close as possible to the CTE of silicon die 14. The closer the CTE of lead frame 12 and the CTE of silicon are to being equal, the more warp resistant package 10 becomes.

Integrated circuit package 10 is preferably thin in profile, and without the preventive measures described herein could warp during fabrication or use due to dissimilar coefficients of thermal expansion in the various layers or component parts which comprise package 10. As illustrated in FIG. 1, to prevent warping while still maintaining a thin profile, thin, warp resistant second layer 20 of lead frame 12 is provided in conjunction with first and third layers 22 and 18. Second layer 20 preferably has a CTE less than that of silicon and is disposed between the first and third layers 22 and 18 as described. The CTE of the second layer 20 in combination with the CTE of first and third layers 22 and 18 results in a composite lead frame 12 CTE approximating that of silicon.

In extremely thin package applications, where the thickness of die 14 is reduced, it may be desirable to adhere or otherwise attach a thin metal layer to the lower inactive surface of die 14 to improve warp resistance and thermal dissipation, as described in U.S. Pat. No. 5,367,766, assigned to the assignee of the present invention and incorporated herein for all purposes.

In these embodiments, the CTE of the material used for second layer 20 is selected to thermally balance and make warp resistant the entire package 10 without requiring a warp resistant material layer to be mounted to the exterior surface of package 10. Thus, the present invention provides a method of warpage control that minimizes the differential thermal expansion forces and moments between the material layers on either side of a neutral thermodynamic axis passing through the package 10 assembly. The neutral thermodynamic axis is chosen for convenience to be the plane through the center of lead frame 12. The total set of warpage-causing moments on either side of the neutral thermodynamic axis includes the sum of the moments associated with each layer comprising package 10, relative to the neutral thermodynamic axis. For a particular layer, the moment, m, is proportional to the following product:

$$m = (E)(h)(t)\Delta(a)\Delta(T)$$

where m is the moment of the package layer; E is the Young's modulus of elasticity of the material of the package layer; h is the moment-arm distance measured from the center of the particular package layer being calculated to the neutral thermodynamic axis; t is the thickness of the particular package layer; $\Delta(a)$ is the difference between the CTE of the particular package layer being calculated and the CTE of the material containing the neutral thermodynamic axis; and $\Delta(T)$ is the temperature difference between the assembly bonding temperature, operating temperature, storage temperature, or other temperature of interest.

The product $\Delta(a)\Delta(T)$ is the source of the warping forces and moments, the product $(E)(t)$ is the deflection compliance of the particular package layer associated with the differential force for that layer, and h is the lever arm allowing the differential force to produce a moment with its resulting warpage.

To calculate the forces, the product in the above equation for the moment, m, is evaluated for each package layer on one side of the neutral thermodynamic axis. These values are then summed. The process is repeated for the package layers on the opposite side of the neutral thermodynamic axis. The two sums are then compared. The dimensions and CTE of the package materials to be used for the various layers in package 10, including each layer of lead frame 12, are adjusted until the sums are either equal or acceptably close enough in value to assure acceptably low values of warpage. In other words, the vectorial summation of all moments of each package layer is selected to be as close to zero as possible.

Another advantage of the present invention is that one can asymmetrically locate elements formed of different, or non-identical, materials in each package 10 and thermally balance them. Thus, integrated circuit die 14 does not have to be symmetrically centered within package 10 to obtain thermal balance throughout package 10. Application of the method of the present invention allows compensation for material and orientation asymmetries to prevent warping.

The foregoing disclosure and description of the invention are illustrative and explanatory of the preferred embodiments. Changes in the size, shape, materials and individual components used, elements, connections and construction may be made without departing from the spirit of the invention.

What is claimed is:

1. An integrated circuit package comprising:
   a substantially planar integrated circuit die formed having an upper surface and a lower surface;
   a lead frame having a planer portion mounted in said package so as to overlay a substantial portion of said upper surface of said die; wherein said lead frame including said planer portion has (1) a first conductor layer electrically connected to the die, (2) a second warp-resistant layer mounted to said conductor layer, and (3) a third layer mounted to said warp-resistant layer for offsetting thermal warping of the conductor layer, wherein the layers are formed of materials and in selected thicknesses so as to provide a composite lead frame coefficient of thermal expansion approximating that of the die.

2. The package of claim 1, wherein said lead frame is formed of a first and second electrically conductive material, said first material having superior electrical and thermal conductivity, and said second material having a coefficient of thermal expansion so as to provide a composite lead frame coefficient of thermal expansion approximating that of silicon.

3. The package of claim 1, wherein said lead frame comprises three layers of warp resistant materials.

4. The package of claim 2, wherein said first material comprises copper and said second material has a coefficient of thermal expansion substantially less than that of copper.

5. The package of claim 2, wherein said first layer comprises copper.

6. The package of claim 2, wherein said second layer comprises alloy 42.

7. The package of claim 2, wherein said second layer comprises INVAR.

8. The package of claim 4, wherein the ratio of copper in said lead frame ranges from about 20% to 33%.

9. The package of claim 2, wherein immediately adjacent layers of said lead frame are comprised of materials having different coefficient of thermal expansion.

10. The package of claim 2, wherein said lead frame has a uniform thickness in an area over said upper surface of said die.

11. An integrated circuit package, comprising:
   a) an integrated circuit die having an upper surface; and
   b) a multi-layered, substantially planar lead frame mounted to a substantial portion of said upper surface of said die and electrically connected thereto;

wherein immediately adjacent layers of said multi-layered lead frame are comprised of materials having different coefficients of thermal expansion, and wherein said lead frame includes a warp resistant layer of material, where for said warp resistant layer, the moment, m, is proportional to the following product:

$$m=(E)(h)(t)\Delta(a)\Delta(T),$$

where E is the Young's modulus of elasticity of the material of the warp resistant layer; h is the moment-arm distance measured from the center of the warp resistant layer to a neutral thermodynamic axis which passes through said lead frame; t is the thickness of the warp resistant layer; $\Delta(a)$ is the difference between the coefficient of thermal expansion of the warp resistant layer and the coefficient of thermal expansion of the material of said lead frame containing said neutral thermodynamic axis; and $\Delta(T)$ is the temperature difference between an assembly bonding temperature, operating temperature, or storage temperature of said package.

* * * * *